United States Patent [19]

Udvardi-Lakos

[11] 4,152,656

[45] May 1, 1979

[54] APPARATUS FOR MONITORING AN AC VARIABLE

[75] Inventor: Janos Udvardi-Lakos, Erlangen, Fed. Rep. of Germany

[73] Assignee: Siemens Aktiengesellschaft, Munich, Fed. Rep. of Germany

[21] Appl. No.: 808,527

[22] Filed: Jun. 21, 1977

[30] Foreign Application Priority Data

Aug. 19, 1976 [DE] Fed. Rep. of Germany ....... 2637397
Mar. 30, 1977 [DE] Fed. Rep. of Germany ....... 2714191

[51] Int. Cl.² .................... H03K 5/18; H03K 5/20; H03B 3/04
[52] U.S. Cl. .................................... 328/155; 328/141; 331/1 A; 331/25; 340/661; 328/148
[58] Field of Search ............... 328/141, 155, 133, 148; 331/25, 1 A, 17, 55; 340/248 A

[56] References Cited

U.S. PATENT DOCUMENTS

| | | | |
|---|---|---|---|
| 3,796,962 | 3/1974 | Hekimian | 328/133 |
| 3,893,042 | 7/1975 | Whitman et al. | 331/55 |
| 3,956,710 | 5/1976 | Seitz et al. | 331/1 A |
| 4,007,429 | 2/1977 | Cadalura et al. | 331/25 |

*Primary Examiner*—John S. Heyman
*Attorney, Agent, or Firm*—Kenyon & Kenyon, Reilly, Carr & Chapin

[57] ABSTRACT

Apparatus for the rapid monitoring of an alternating (a-c) variable with respect to amplitude, frequency and phase which includes a generator circuit for forming, from an actual a-c voltage imaging the monitored a-c variable, a reference a-c voltage of predetermined amplitude and frequency which is linked to the former in rigid phase relationship, and comparators for comparing individual signals of the generator circuit with the instantaneous values of the actual value a-c voltage, permitting recognition of disturbances in a time which is substantially shorter than one period of the a-c variable monitored.

9 Claims, 13 Drawing Figures

APPARATUS FOR MONITORING AN AC VARIABLE

BACKGROUND OF THE INVENTION

This invention relates to apparatus for monitoring a-c variables of predetermined periodic waveform with constant amplitude, frequency and phase in general, and more particularly, to improved, quick acting monitoring apparatus.

For monitoring alternating (a-c) variables, an actual value a-c voltage which is taken off from a suitable measuring pickup or measuring transducer, can be rectified and smoothed as well as possible. For instance, by using a Graetz (full-wave) bridge as the rectifier circuit, one obtains a rectified voltage with two pulses from the actual value a-c voltage. The smoothing member, i.e., filter, following the rectifier circuit, usually a capcitor, has a smoothing time constant which is long relative to the period of the a-c variable monitored in order to smooth the voltage rectified by the rectifier circuit sufficiently. The rectified and smoothed voltage has a rectified value which corresponds, with a high resistance termination, essential to the ideal no load d-c voltage of the rectifier circuit. The rectified value of the actual value a-c voltage can be compared with a very constant reference value d-c voltage or fed to a limit indicator with a predetermined response threshold. However, the rectified value of the actual value a-c voltage only follows the monitored a-c variable with a delay caused by the smoothing time constant of the smoothing member, so that, for instance, rapid detection of voltage breaks or voltage spikes and of phase changes and frequency changes in the monitored a-c variable is not possible.

SUMMARY OF THE INVENTION

It is an object of the present invention to permit monitoring an a-c variable in such a manner that impermissible deviations from a predetermined periodic waveform with constant amplitude, frequency and phase can already be detected in a time which is very short relative to the period of the monitored a-c variable.

According to the present invention, this problem is solved by an apparatus for monitoring an a-c variable, which is characterized by a generator circuit which forms, from an actual value a-c voltage imaging the monitored a-c variable, a reference voltage of predetermined amplitude and frequency which is linked to the former in rigid phase relationship, as well as by a comparison device for the instantaneous values of the actual value a-c voltage and the reference a-c voltage. Comparing the instantaneous values of two a-c voltages coupled in rigid phase relationship permits detecting deviations of the parameters of the actual value a-c voltage from the in phase reference a-c voltage extremely fast and processing them into protective or alarm signals or signals for control intervention.

In one embodiment of the invention, the generator circuit comprises a phase control circuit which contains a phase detector followed by a lowpass filter, with an amplifier following the latter and an oscillator controlled by the output voltage of the amplifier. The output signal of the oscillator is in phase with the input voltage of the phase detector and is fed back to the reference input of the phase detector. The signal input of the phase detector is the actual value a-c voltage of a voltage derived therefrom. Suitable phase control circuits of this type are known as phase locked loops (PLL) and are commercially available. Such phase control circuits are described, for instance, in the paper by J. A. Mattis, "The Phase-Locked Loop, A Communication System Building Block" (Broadcasting Engineering, Feb. 1972) and, in the paper by Dr. Joachim Ziemann, "Wirkungweise unde Anwendung von integrierten Phase-lock-loop-Schaltungen" — Operation and Application of integrated phase-lock loop circuits (Der Elektrotechniker No. 1/1973, EL 14 to 19). Design and application examples are described in a publication by Signetics entitled "Linear Integrated Circuits", pages 195 to 304.

In the apparatus according to the present invention, the property of a PLL circuit in which, in the steady state condition, the output voltage of the voltage controlled oscillator, fed back to the reference input of the phase detector, is linked to the input voltage of the PLL circuit in rigid phase relationship is used in a novel way. The amplitude of the output voltage of the voltage controlled oscillator of a PLL circuit has a value which is independent of the input voltage of the phase detector. A further advantage of using a PLL circuit is that the output voltage of the voltage controlled oscillator has an undisturbed waveform even in the presence of interference voltage spikes of the actual value a-c voltage, e.g., an undisturbed sinusoidal shape.

In accordance with a further feature of the present invention, the comparison device for determining amplitude deviations or excessive harmonics of the monitored a-c variable contains a comparison member to the inputs of which are fed the actual value a-c voltage and the output signal of the voltage controlled oscillator having the predetermined periodic waveform. The output voltage of the voltage controlled oscillator, which is in phase with the input voltage of the phase detector, forms the reference a-c voltage which is compared with the actual value a-c voltage. A balancing device for balancing the amplitudes for the actual value a-c voltage and/or for the reference a-c voltage may be provided.

For determining impermissible deviations of a sinusoidal a-c variable, a further embodiment of the circuit according to the present invention provides a phase control circuit, the voltage controlled oscillator of which generates a square wave, first output signal which is in phase with the input signal of the phase detector, and a second sinusoidal output signal which is shifted relative thereto by a predetermined phase angle. The actual value a-c voltage is fed via a phase shifter, with a phase shift corresponding to the predetermined phase angle, to the signal input of the phase detector. The rectangular first output signal of the voltage controlled oscillator is fed back to the reference input of the phase detector. The second sinusoidal output signal of the voltage controlled oscillator and the actual value a-c voltage are fed to the comparator. In this embodiment of the invention, a particularly good rigid phase coupling of the reference a-c voltage to the actual value a-c voltage can be achieved, as the phase detector is controlled by a square wave voltage at its reference input. In addition, particularly high insensitivity to distortion, harmonics and interference spikes in the monitored a-c variable can be achieved by an integrating phase shifter.

One further embodiment of the invention provides that the comparator for determining frequency deviations of the monitored a-c variable contains at least one limit indicator with a predetermined threshhold, to which the input signal for the voltage controlled oscillator is fed on the input side. If in an a-c network only frequency breaks or lowered frequency is expected, the input signal for the voltage controlled oscillator in the phase control circuit is fed only to one limit indicator, the response threshhold of which is set to the just still permissible frequency lowering. If lowering as well as increases of the frequency are expected in the monitored a-c variable, then two limit indicators with correspondingly set response threshholds may be provided.

One further embodiment of the invention provides that the comparator contains, for ascertaining phase jumps of the monitored a-c variable, a further limit indicator with a predetermined response threshhold, to which the output signal of the phase detector in the phase control circuit is fed on the input side. If it appears advantageous for the application, the output signal of the phase detector can be conducted via a filter.

The output signals of the comparator can be evaluated directly as protective signals or as alarm signals for excessive deviations of the amplitude and/or the frequency and/or the phase of the monitored a-c variable. The invention can be used, however, in a particularly advantageous manner for controlling a-c variables. In known control arrangements for a-c variables, particularly for a-c voltages, the control input channel of the control is connected to a potentiometer which is connected to a highly constant d-c voltage. The control input channel of the control is equipped with a rectifier circuit for the actual value a-c voltage taken off from the a-c variable via a measuring transducer and a smoothing member following the rectifier circuit for smoothing the rectified actual value a-c voltage. The best possible smoothing of the actual value a-c voltage is desired, since the remaining ripple of the actual value voltage fed to the control in the control input channel is passed on, amplified, in the control output voltage. The time constant of the control is chosen so that the residual ripple of the rectified value, remaining in spite of the smoothing of the actual value, just does not yet have an interferring effect. The time constants of the smoothing member and the control determine the possible dynamic gain of the control circuit. The control deviation for driving the control i.e., the error signal into the control, is formed by a reference/actual value comparison between a very constant d-c voltage and the rectified value of the actual value a-c voltage, and therefore, by a comparison of two d-c voltages.

Known control arrangements for a-c variables are designed so that, first, the time integral over at least one period of the a-c variable is formed, as is described by the general definition of a-c variables. Therefore, information as to whether the a-c variable in question stays within its predetermined reference value or deviates therefrom is not available before the end of at least one period. Known controls act on the rectified value of the a-c variable but not on its rms value, as would be desirable for many applications.

For the reasons mentioned, the control time constants of the control loop, overall, the chosen longer than a period in known controls. The dynamic gain of the control loop thereby becomes accordingly small. The control becomes sluggish. The possibility of fast positioning by modern control elements, e.g., by pulsed inverters, cannot be utilized. It is furthermore a disadvantage that the control action is in reference to the rectified value of the a-c variable but not to its rms value.

The present invention permits the control of apparatus for generating a-c variables, particularly of a-c voltages, by the provision that at least one output voltage of the comparator is used as the control deviation which drives the control, the output signal of which constitutes the controlled variable. The reference/actual value comparison can be performed at the inverting input of a control amplifier or in a differential amplifier preceding it.

In one control arrangement according to the present invention, the control difference driving the control is not obtained by comparison of two d-c voltages, but by the comparison of the instantaneous values of two a-c voltages coupled in rigid phase relationship. There is no actual value smoothing or smoothing only with a time constant which is small relative to the period of the a-c variable. The control difference follows at every considered instant, without delay, the difference of the instantaneous values of the actual value a-c voltage and the reference a-c voltage. Thereby, it is possible to control with a control time constant which is shorter than one-half a period of the a-c variable. The a-c variable to be controlled can be made to follow its desired value even within a half-period. This makes it possible to hold instantaneous values better and thereby, also to regulate the rms value of the a-c variable.

If a variable amplitude reference value is to be provided for such a control arrangement, the output voltage of the phase controlled oscillator of the PLL circuit can be coupled via a setting potentiometer. For complex controls, an embodiment is particularly advantageous, in which the reference a-c voltage is fed to a multiplier, the second input of which is acted upon by a control voltage of a superposed control or regulating circuit and the output of which is connected to the comparator or the comparison point of the control.

In order to make provision in a control with integrating time behavior, that, for a control deviation present in the same direction, the sign of the control difference driving the control does not change in each half-wave of the a-c variable, but stays the same, it is advantageous to couple the actual value a-c voltage via a rectifier circuit and the reference a-c voltage via another rectifier circuit. However, it is also possible to let a rectifier circuit with the correct phase follow the comparator.

BRIEF DESCRIPTION OF THE DRAWINGS

FIG. 1b illustrates important signal waveforms from FIG. 1a.

FIG. 2b illustrates important signal waveforms from FIG. 2a.

FIG. 3b illustrates important signal waveforms of FIG. 3a.

FIG. 4b illustrates important signal waveforms from FIG. 4a.

FIG. 7b is a block diagram of a monitoring circuit for the protected power supply of FIG. 7a.

DETAILED DESCRIPTION OF THE INVENTION

Figure 1A:
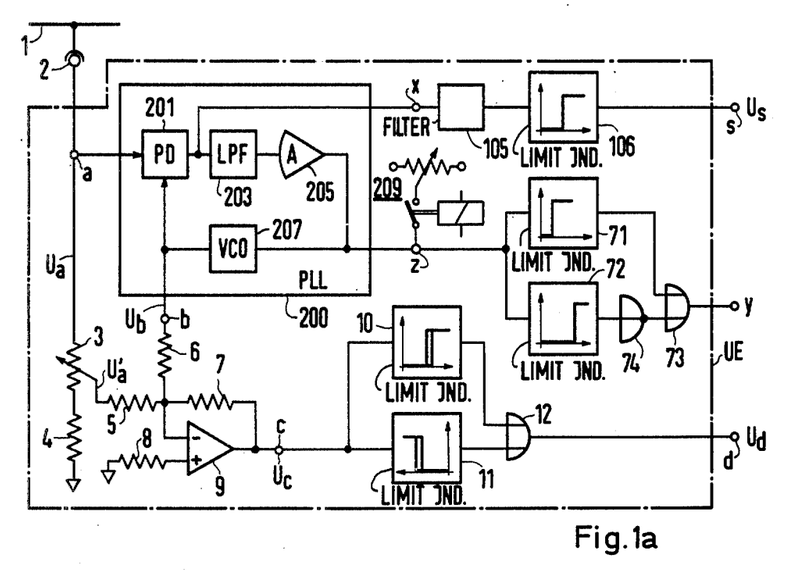
FIG. 1a is a schematic diagram of an embodiment of a circuit for monitoring an a-c voltage.

In FIG. 1a, a voltage measuring transformer 2, at the output a of which an actual value a-c voltage $U_a$ appears, is connected to an a-c bus bar 1. The actual value a-c voltage $U_a$ is fed to the signal input of a phase detector 201 of a phase control circuit 200. The phase control circuit 200 contains a lowpass filter 203 following the phase detector, an amplifier 205 following the former and an oscillator 207 controlled by the output voltage of the amplifier 205. The output voltage of the amplifier 205 can be switched to a predetermined potential by operating a relay 209 in order to set the voltage controlled oscillator 207 to a corresponding fixed frequency, for instance, in the event of a voltage failure on the a-c bus bar 1.

The fact that the output voltage $U_b$ of the voltage controlled oscillator 207 at the terminal b is in phase with the input voltage of the phase detector 201 in the steady state condition, but has an amplitude which is independent of the input voltage $U_a$ for determining amplitude deviations of the monitored a-c voltage is utilized.

The actual value a-c voltage $U_a$ is coupled through a balancing device which comprises a potentiometer 3 and a fixed resistor 4 to ground. By means of this adjusting device, the amplitude of the actual a-c voltage $U_a$ appearing at the top of the potentiometer 3 is adjusted to the amplitude of the reference a-c voltage $U_b$.

The balanced actual value a-c voltage $U_a$ is fed via a first input resistor 5, and the reference a-c voltage $U_b$ via a second input resistor 6, to the inverting input of an operational amplifier 9. The non-inverting input of the operational amplifier 9 is connected to the reference potential, i.e., ground, via a high resistance 8. Operational amplifier 9 has an ohmic resistor 7 in its feedback path. The operational amplifier 9 works as a comparator in this circuit. The adjusting actual value a-c voltage $U_a$ and the reference a-c voltage $U_b$ are fed to its input. The difference voltage $U_c$ between the two input voltages appears at the output terminal c of the operational amplifier 9. The difference voltage $U_c$ is an input to a first limit indicator 10 with a predetermined positive response threshhold U10, as well as an input as a second limit indicator 11 with a predetermined negative response threshhold U11. The output signals of the limit indicators 10 and 11 are linked disjuntively in an OR gate. At the ouput of the OR gate 12 a signal voltage $U_d$ appears.

Figure 1B:
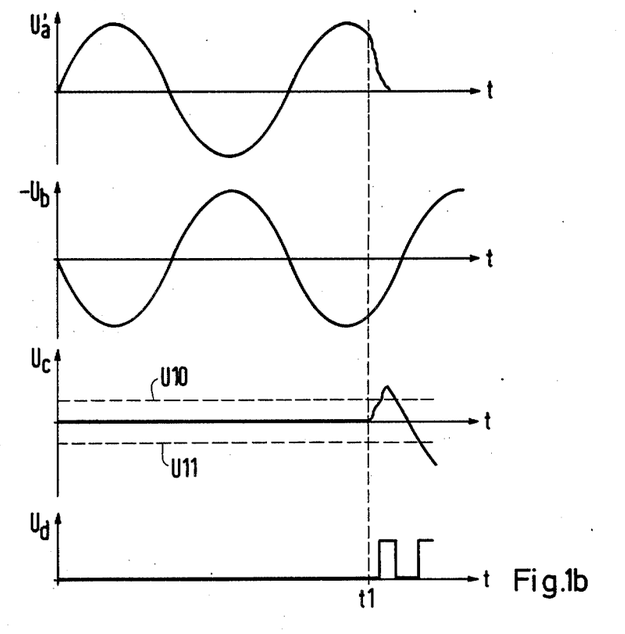

The operation of the circuit shown in FIG. 1a will be explained in detail with the aid of FIG. 1b. The adjusted actual value a-c voltage $U_a$ initially has its correct sinusoidal waveform. At the time $t_1$, the monitored a-c voltage breaks down. The output voltage $U_b$ of the voltage controlled oscillator 207 of the PLL circuit, however, continues at first to run unchanged, since the lowpass filter 203 acts as a delay line. A voltage break of the monitored a-c voltage, which is imaged in the adjusted actual value a-c voltage $U_a$, is immediately recognizable in the voltage difference $U_c$ of the comparator elements 5 to 9. Even after only a short time relative to the period, the positive response threshhold U10 of the limit indicator 10 is exceeded. In the output signal $U_d$ a first change in the signal, which can be used for an alarm signal or a control intervention appears. A memory, for instance, which is set by a dynamic signal flank i.e., rising or falling edge, can be connected to the output terminal d. Simultaneously, the relay 209 can also be actuated in order to drive the oscillator 207 with a predetermined voltage.

For determining frequency deviations of the voltage at the a-c voltage bus bar 1, a circuit with two limit indicators 71 and 72, an inverter 74 and an OR gate 73 is used. The output voltage of the amplifier 205 which is present at the terminal z and which is the control voltage for the voltage controlled oscillator 207, is fed to a first limit indicator 71 and a second limit indicator 72. The response threshholds of the two limit indicators are chosen according to the permissible frequency deviations of the monitored a-c voltage. The output signals of the two limit indicators 71 and 72 are disjunctively linked in OR gate 73 to form a frequency disturbance signal at the terminal y, the signal from limit indicator 72 first being inverted through inverter 74.

To monitor the voltage of the a-c bus bar 1 with respect to phase jumps, the output voltage of the phase detector 201 is coupled through a band stop filter 105. In the output voltage of the band stop filter 105, phase deviations at the terminal x are immediately recognizable. In the case of phase jumps, a signal appears without delay. This signal is fed to a further limit indicator 106 with a predetermined response threshhold. The signal $U_s$ at the output terminal s of the limit indicator 106 can be evaluated as a phase disturbance signal.

Figure 2A:
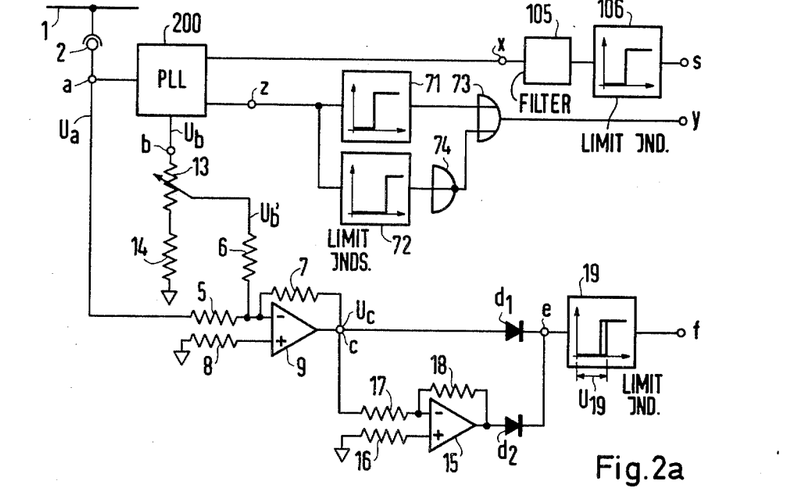
FIG. 2a is a schematic diagram of another embodiment of a circuit for monitoring an a-c voltage.

In FIG. 2a, a voltage measuring transformer 2 is again connected to an a-c bus bar 1; its output voltage $U_a$ is fed to a phase control circuit 200 which is designed as in FIG. 1a, i.e., as a PLL. The output voltage of the voltage controlled oscillator in the PLL circuit 200, which is in phase with the actual value a-c voltage $U_a$, is coupled via an adjusting device which consists of a potentiometer 13 and a fixed resistor 14 to ground to the inverting input of an operational amplifier 9. The actual value a-c voltage $U_a$ is also fed to the inverting input of the operational amplifier 9 connected as a differential amplifier, via a first input resistor 6. The difference voltage $U_c$ appears at the output terminal c of the operational amplifier 9. The difference voltage $U_c$ is coupled via a diode d1 to the input e of a limit indicator 19 with a response threshhold U19. The difference voltage $U_c$ is further coupled via an inverter stage, which comprises an operational amplifier 15 with a feedback resistor 18. The difference voltage $U_c$ is fed to the inverting input of the operational amplifier 15 via an input resistor 17. The non-inverting input of the operational amplifier 15 is connected to the reference potential e.g., ground, via a high resistance 16. The output voltage of the operational amplifier 15 is also fed, via a further diode d2, to the input e of the limit indicator 19. The output of the limit indicator 19 at the terminal f changes if the absolute value of the difference voltage at terminal c, fed to it via the diodes d1 or d2 exceeds its response threshhold U 19.

Figure 2B:
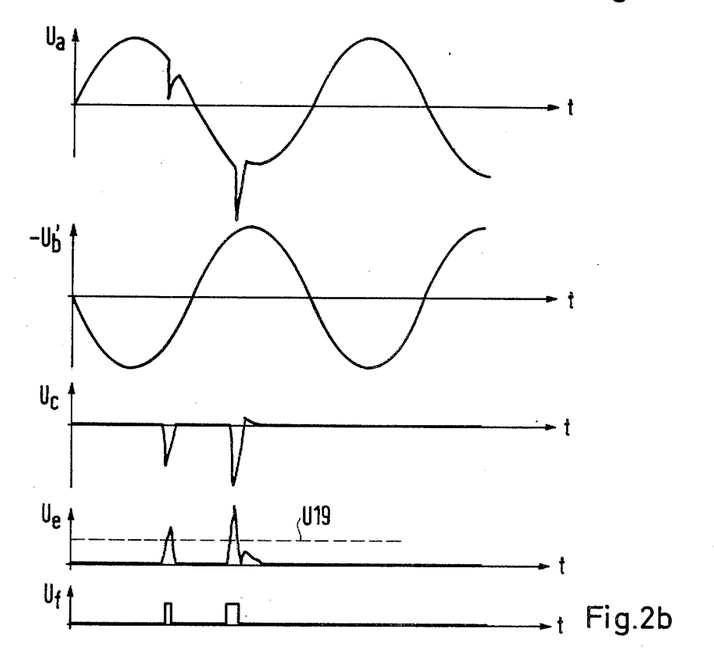

In the signal waveforms of FIG. 2b, it becomes clear how the circuit according to the present invention allows an indication of impermissible voltage spikes in the monitored a-c voltage on the a-c voltage bus bar 1. Let us assume that the actual value a-c voltage $U_a$ has the waveform indicated. The adjusted reference voltage $U_b$ has an undisturbed sinusoidal waveform in spite of the spikes, in the actual value value a-c voltage, since the PLL circuit 200 is not disturbed by such voltage spikes. The deviations of the actual value a-c voltage from the reference a-c voltage appear in the difference voltage $U_c$ and in the rectified difference voltage $U_e$. As soon as the rectified difference voltage $U_e$ exceeds the response threshhold $U19$ of the limit indicator 19, pulses appear in the output voltage $U_f$ of the limit indicator, which can be evaluated in a suitable manner.

Special attention is called to the second disturbance in the actual value a-c voltage $U_a$. It is assumed that the voltage-time areas of the deviations from the sinusoidal waveform in opposite directions are approximately equal. In one of the known monitoring devices described at the outset, the second disturbance shown could not be noted at all. However, as such peaks often presage a serious disturbance which itself occurs only later, the monitoring of the a-c variable for such peaks can be of great importance. For instance, through the pulse of the output voltage $U_f$ of the limit indicator 19, an alarm can be released which causes the operating personnel to observe the waveform of the monitored a-c variable on an oscilloscope in order to obtain further information regarding the cause of the disturbance.

The circuits for monitoring the a-c voltage on the bus bar 1 with respect to frequency and phase are designed in the same manner as was already described in connection with FIG. 1a.

Figure 3A:
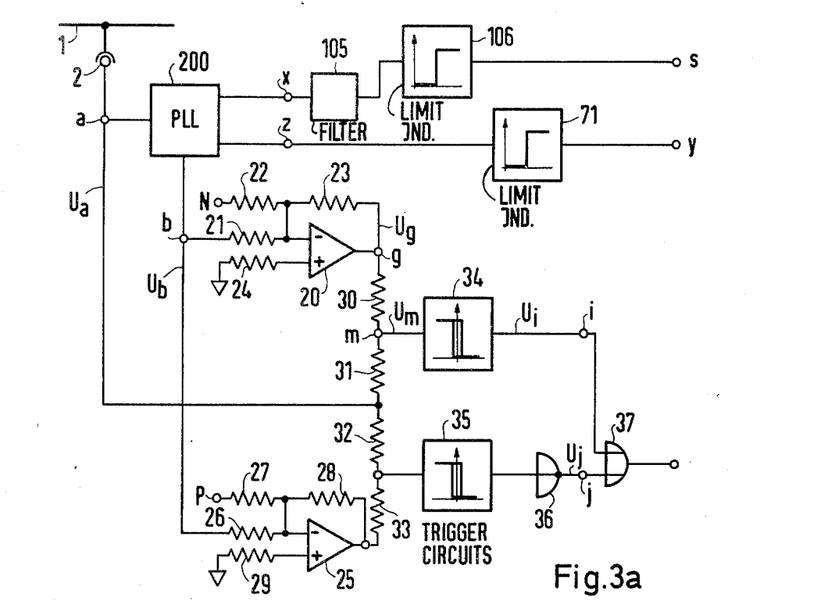
FIG. 3a is a schematic diagram of another embodiment of a circuit for monitoring an a-c voltage.

In the circuit shown in FIG. 3a, a voltage measuring transformer 2 is again connected to an a-c voltage bus bar 1; its output voltage $U_a$ appearing at the terminal a is fed to a phase control circuit 200. The phase control circuit 200 is designed as in FIG. 1a, i.e., it is a PLL. The output voltage $U_b$ appearing at its output terminal b obtained from its voltage controlled oscillator, is fed to a first amplifier circuit and to a second amplifier circuit, the output voltages of which are connected in opposition to the actual value a-c voltage. The first amplifier circuit contains an operational amplifier 20 with an ohmic resistance 23 in its feedback path. The inverting input of the operational amplifier 20 is coupled via an input resistor 22 to a negative bias N. The non-inverting input of the operational amplifier 20 is connect via a high resistance 24 to the reference potential. The output voltage $U_g$ appearing at the output g of the operational amplifier 20 is therefore shifted in the positive direction relative to the reference a-c voltage $U_b$ by the amount of the bias N.

The rest of the amplifier circuit is designed in an analogous manner and contains an operational amplifier 25, the feedback path of which is equipped with an ohmic resistor 28. The inverting input of the operational amplifier 25 is acted upon by the reference a-c voltage $U_b$ via an input resistor 26 and by a positive bias P via a further input resistor 27. The non-inverting input of the operational amplifier 25 is connected to the reference potential via a high resistance 29. The voltage at the output of the operational amplifier 25 is shifted in a negative direction relative to the reference a-c voltage $U_b$ by the amount of the bias P.

The output voltage $U_g$ of the operational amplifier 20 is connected to the input m of a trigger circuit 34 via a resistor 30. The actual value a-c voltage $U_a$ is likewise connected with opposite polarity to the summing input m of trigger circuit 34 via a further input resistor 31.

The voltage $U_m$ between the two resistors 30 and 31 corresponds to the bias N. The trigger 34 changes its output signal if its input voltage $U_m$ goes through zero. As soon as a voltage spike occurs in the monitored actual value a-c voltage $U_a$ and the input voltage $U_m$ of the trigger 34 changes its polarity, it changes its output signal $U_i$.

Similarly, the output voltage at the output of the operational amplifier 25 is fed via a resistor 33 opposed to the actual value a-c voltage $U_a$ brought in via a resistor 32. The trigger 35 changes its output signal if its input voltage goes through zero. As soon as the actual value a-c voltage $U_a$ has a voltage spike and the input voltage of the trigger 35 changes its polarity, the trigger 35 changes its output signal. The output signal of the trigger 35 is inverted in an inverter stage 36 in order to obtain the same signal representation as in the case of the output signal of the trigger 34. The output signal $U_j$ at the output terminal j of the inverter stage 36 and the output signal $U_i$ of the trigger 34 are combined in an OR gate 37.

The voltage on the a-c voltage bus bar 1 is monitored with respect to holding the frequency under the assumption that only voltage breaks or lowered voltage of the monitored voltage can happen. Accordingly, only a single limit indicator 71 is provided, the response threshhold of which is chosen so that its output signal changes if the frequency of the monitored a-c voltage falls below a predetermined value. The monitoring for phase jumps is accomplished in the same manner as was already described in connection with FIG. 1a.

Figure 3B:
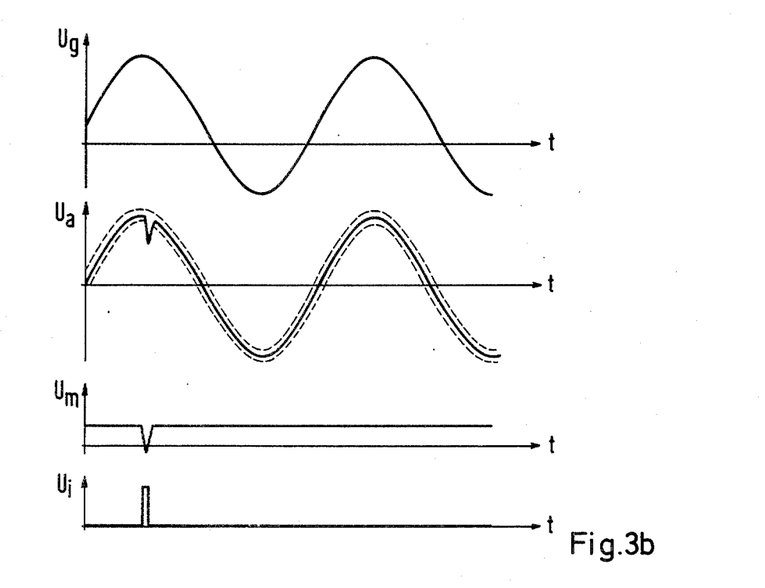

FIG. 3b shows the waveform of the voltage $U_g$ at the terminal g as well as the waveform of the actual value a-c voltage $U_a$ with a voltage spike and the waveform of the voltage $U_m$ at the terminal m. As soon as the peak in the actual value a-c voltage $U_a$ exceeds a predetermined tolerance and the peak in the voltage $U_m$ caused by the peak in the actual value a-c voltage crosses the zero line, a pulse appears in the voltage $U_i$.

Figure 4A:
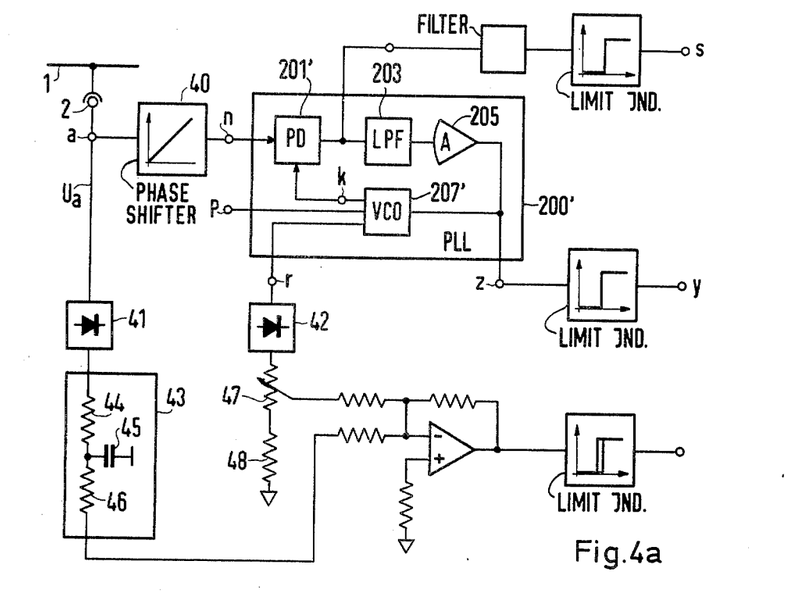
FIG. 4a is a schematic diagram of a further embodiment of a circuit for monitoring an a-c voltage.
Figure 4B:
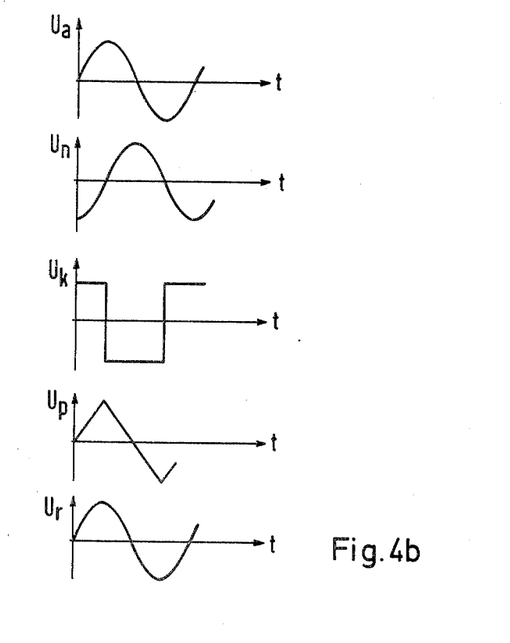

FIG. 4a shows a further embodiment of a circuit according to the invention which allows an improvement of the rigid phase coupling between the output voltage of the voltage controlled oscillator in the phase control circuit and the input voltage of the phase detector. To the a-c voltage bus bar 1 is again connected a voltage measuring transformer 2, at the output a of which the actual value a-c voltage $U_a$ appears. The output voltage $U_a$ is fed to a phase shifter 40 which may be designed as a differentiator, but prefereably as an integrator. The phase shifter 40 provides, for instance, a phase shift of $\pi/2$. The output voltage $U_n$ at the output n of the phase shifter 40 is fed to a phase detector 201' of a phase control circuit 200'. The phase control circuit 200' again contains a lowpass filter 203 and an amplifier 205 as well as a voltage controlled oscillator 207'. The voltage controlled oscillator 207' has three outputs, k, p, and r, at which output voltages $U_k$, $U_p$, and $U_r$ are present. The output voltage $U_k$ is a square wave signal which is in phase with the input voltage $U_n$ of the phase discriminator 201'. The output voltage $U_p$ is a triangular signal, which will not be evaluated further in this context. The output voltage $U_r$ is a sinusoidal a-c voltage which is shifted relative to the input signal $U_n$ by the sam phase angle by which the phase shifter 40 shifts the input voltage $U_a$, i.e., likewise by $\pi/2$. Thus, however, the phase of the actual value a-c voltage $U_a$ agrees with the phase $U_r$ at the output r of the voltage controlled oscillator 207', as is seen in FIG. 4b. The voltage $U_r$ is therefore utilizied as a reference a-c voltage. A suitable voltage controlled oscillator is obtainable from the firm Intersil under the designation ICL 8038. A suitable phase comparator is obtainable from the firm National Semiconductor under the designation LM 1496.

The reference a-c voltage $U_r$ is rectified in a rectifier circuit 42, for instance, a Graetz (fullwave) bridge and routed via an adjusting device with a potentiometer 47 and a fixed resistor 48. The tap of the potentiometer 47 is connected to a comparator which is connected in the manner already described in connection with FIG. 1a as a differential amplifer. The comparator is followed by a limit indicator. The actual value a-c voltage $U_a$ is fed to the comparator via a rectifier circuit 41, for instance, likewise a Graetz bridge, and a filter 43. The filter 43 contains the resistors 44 and 46 as well as a capacitor 45, which is connected to a ground. The time constant of the filter is chosen very small as compared to the period of the a-c voltage to be monitored. The time constant of the filter may be, for instance, 0.5 msec for a network frequency of 50 or 60 Hz. The time constant of the filter is therefore substantially shorter than the smoothing time constant on the conventional actual value smoothing mentioned at the outset, which, as is well known, must already have a high attenuation at twice the operating frequency. The time constant of the filter is chosen so short that only interference voltage peaks are suppressed but the waveform of the fundamental in the output voltage of the rectifier circuit 41 is not affected. The filter 43 is to suppress only such interference voltage spikes, the evaluation of which is of no interest in the case in question. It may be possible in some cases to dispense with the capacitor 45 in such a filter. Similarly, complex filters can also be used as filters, for instance, for suppressing certain harmonics of the actual value a-c voltage.

FIG. 4b shows the waveform of the actual value a-c voltage $U_a$, the output voltage $U_n$ of the phase shifter 40, the square wave output voltage $U_k$, the triangular output voltage $U_p$ and the sinusoidal output voltage $U_r$ of the voltage controlled oscillator 207'. It is seen that the sinusoidal output voltage $U_r$ of the voltage controlled oscillator 207' is in phase with the actual value a-c voltage $U_a$. The phase shifter 40 compensates for the phase shift which exists between the squarewave output voltage $U_k$, fed back to the reference input of the phase detector 201', of the voltage controlled oscillator 207', and its sinusoidal output voltage $U_r$.

In FIGS. 1 to 4, the monitoring of an a-c voltage, always with respect to amplitude, frequency and phase, was shown. It should be particularly pointed out that it is sufficient in many applications to monitor only one or two of these parameters. The components which are required for the parameters which are of no interest can be omitted in these cases.

Figure 5:
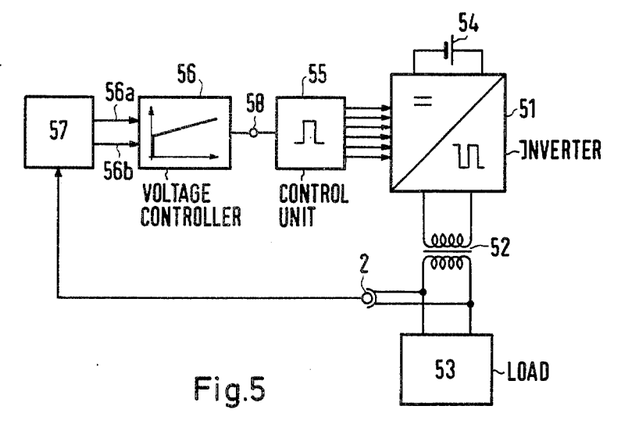
FIG. 5 is a block diagram of a control arrangement for an inverter.

FIG. 5 shows the application of the present invention to the rapid control of a device for generating an alternating variable. Such a device, in the form of an inverter 51 for generating an a-c voltage, is connected to a load 53 via a transformer 52. The input of the inverter 51 is connected to a d-c source 54, which is pictured as a battery. However, a d-c bus bar or, in particular, a controlled or uncontrolled rectifier, the output of which is connected to the inverter via an intermediate link, may also be provided as the d-c source. The arrangement of a rectifier, an intermediate link and an inverter constitutes a frequency changer. A control unit 55 with an internal frequency standard, which generates the firing pulses for the controlled valves, particularly thyristors, of the inverter 51, preferably by a pulse width modulation method, is associated with the inverter 51. The control angle of the firing pulses and the amplitude of the load voltage depending thereon is determined by the output voltage of a voltage regulator 56 fed to the control unit 55 at the control voltage input 58. The control input channel 56b and the controlled variable channel 56b of voltage regulator 56 are connected to a circuit 57. The input of the circuit 57 is connected to a voltage measuring transformer 2 for measuring the actual value a-c voltage, which images the load voltage.

Figure 6:
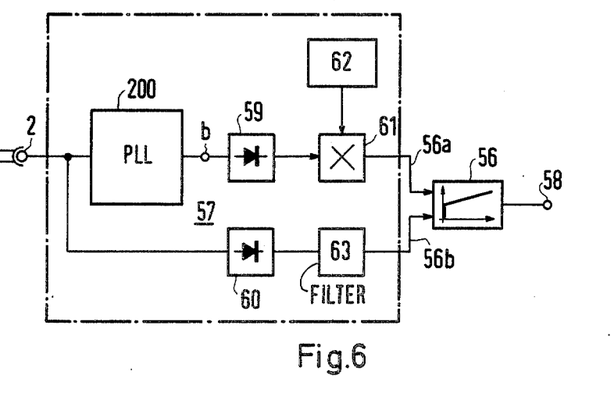
FIG. 6 is a block diagram of the circuit preceding the control in FIG. 5.

FIG. 6 shows the design of the circuit 57 and its interaction with the voltage regulator 56. The actual value a-c voltage from the voltage measuring transformer 2 is fed via a rectifier circuit 60 to the controlled variable channel 56b of the voltage regulator 56. In this channel a filter 63, such as was already described in connection with FIG. 4a, may also be arranged. The actual value a-c voltage is in addition fed to a phase control circuit 200. The output voltage of the voltage controlled oscillator of the phase control circuit 200 is fed via a further rectifier circuit 59 and a multiplier 61 to the control input channel 56a of the voltage regulator 56. The second input of the multiplier 61 is acted upon by a control voltage from a block 62. In the simplest case, the block 62 may contain a setting potentiometer which is connected to a d-c voltage. However, the block 62 may also represent a superposed control device or a superposed regulating device. The amplitude of the reference a-c voltage can therefore be changed electronically by a control voltage which is generated in a superposed control or regulating circuit. The input of voltage regulator 56 where the two inputs are compared, e.g., subtracted, thus becomes the comparison device of the present invention. This is an amplitude comparison.

A particularly advantageous application of the control according to the present invention is obtained in the voltage regulation of pulsed inverters. A pulsed inverter is a very fast control element, the output voltage of which can be changed within a half-wave. The fast setting of voltage, however, cannot be utilized fully with the voltage controls customary heretofore. With a control arrangement based on the present invention in the control device of a pulsed, inverter, however, it is possible to realize extremely rapid voltage setting.

The invention has been described up to now only as far as its application to sinusoidal a-c variables. The invention is not limited thereto, however. Rather, alternating variables which have different waveforms, e.g., squarewave, triangular or trapezoidal alternating variables, can also be monitored or controlled. It is merely necessary that the voltage controlled oscillator of the phase control circuit generates a voltage of similar waveform which is in phase with the actual value a-c voltage or that such a voltage can be derived from the output voltage of the voltage controlled oscillator.

In the control arrangements shown in FIGS. 5 and 6, monitoring of frequency and phase is not provided. Therefore, the limit indicators 71 and 72 and the gates 73 and 74 can be omitted and likewise, the band stop filter 105 and the limit indicator 106.

A further important example of an application of the invention is in protected power supplies with inverters.

Figure 7A:
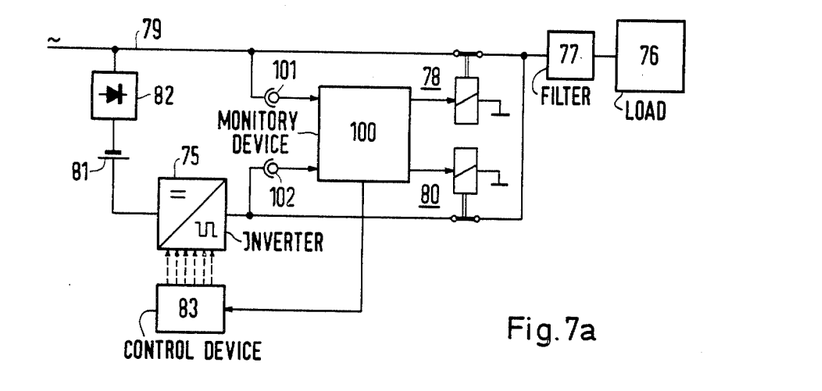
FIG. 7a is a block diagram of a protected power supply.

FIG. 7a shows, as an example of an application of the present invention, the use of an inverter 75 in a protected power supply. In normal operation, a load 76 is supplied from a single phase or three phase network 79 via a series filter 77 and a line switch 78. For emergency operation, a static inverter 75, which is connected via an inverter 80, is used. It has its input coupled to a battery 81 which is charged by a charging rectifier 82 or is kept on trickle charge. A control device 83 comprising a control unit for generating firing pulses for its controlled semiconductor valves is associated with the inverter 75. There is furthermore provided a monitoring device 100, to the input of which is connected a voltage tap 101 for the network 79 and a further voltage tap 102 for the output voltage of the inverter 75. The monitoring device 100 monitors the line voltage and, in the event of an excessive deviation, generates control signals for the switching devices as well as a signal to the control device 83 of the inverter 75 to start the inverter.

If the line voltage is proper, the load is supplied during normal operation from the single phase or three phase network 79. The line switch 78 is closed. The inverter 75 is in standby position, in which its semiconductor valves are not acted upon by firing pulses. The inverter switch may therefore also be closed. The battery 81 is kept on trickle charge by the charging rectifier 82. The monitoring device 100 is in operation and continuously monitors the voltage of the network 79. Upon an excessive deviation of the line voltage with respect to amplitude or frequency, the monitoring device 100 switches the load 76 over to the emergency power supply via the inverter 75. For this purpose, the line switch 78 is opened and the inverter is started.

If, after the network trouble is corrected, the line voltage has again reached its normal value and retains it over a certain period of time without disturbance, then the monitoring device 100 causes a switching operation to normal operation with supply from the network 79. For this purpose, the line switch 78 is closed and the inverter switch 80 is opened. The inverter and its control device are stopped. Thereupon, the inverter switch 80 can be reclosed. The battery 81 is charged via the charging rectifier 82. Since in public power supply systems, one needs to reckon only with short interruptions, the charging rectifier 82 need not be designed for the full load capacity. Rather, one can assume that sufficient time is available for recharging the battery 81 and the charging rectifier can be designed accordingly small.

A fuel cell arrangement or a capacitor arrangement, for instance, may also be provided as the energy storage device besides a battery. It is also possible to use the inverter for feeding the load only until another emergency power supply unit is ready, for instance, until a turbine or Diesel unit has been started up or a flywheel drive has been connected up.

The interruption free power supply shown is distinguished by an extraordinarily high efficiency in normal operation. If the load is supplied from the network, no energy conversion with losses of any kind takes place. The output portion of the inverter is stopped. No losses or noise are produced in the commutation circuits of the inverter, and particularly not in transformers and chokes. However, it is also possible to operate the inverter in the standby position at no-load.

In the power supply according to FIG. 7a, a brief interruption of the supply at the input of the filter 77 can occur by the opening of the line switch 78 when switching from normal operation to emergency operation. Brief interruptions at the filter input can also occur due to the switching porcesses when switching back from emergency operation to normal operation. For many consumers, such brief interruptions are permissible. On the other hand, there are also applications in which even interruptions in the order of switching times of circuit breakers are not permissible. In these cases, an interruption of the supply to the load can be avoided by the provision that the filter supplies energy to the load during the switching operation. With appropriate design of the elements of the filter, possibly including energy storing elements in the load itself, e.g., impedances, the supply to the load can assured in such a manner that the voltage deviations permissible for it can be kept. Particularly a band pass filter which customarily follows an inverter for filtering its squarewave output voltage in order to obtain a sine voltage can be used as the filter 77. The filter 77, therefore, does not represent additional costs. Due to its arrangement between the switching devices and the load, the filter 77 is always connected in series with the load. In normal operation, it attenuates the low and high frequency disturbances of the line voltage. During the switching operation from normal operation to emergency operation, the filter acts as a short time energy storage device. During emergency operation via the inverter, it filters the output voltage of the latter. As these requirements are not contradictory, it is possible to design the elements of the filter accordingly.

Figure 7B:
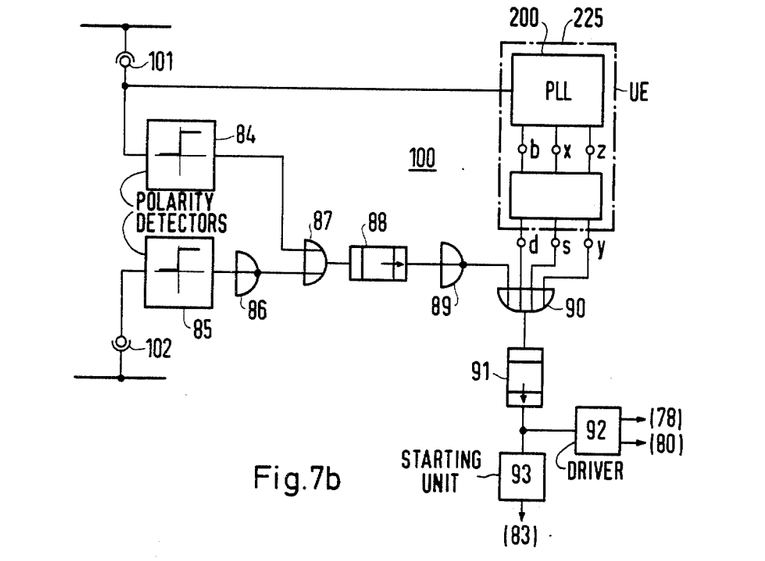

FIG. 7b shows an example of a monitoring device 100 designed in accordance with the present invention. A monitoring unit 225 which is designed, for instance, as in FIG. 1 and which has a phase control circuit 200 and evaluation units i.e., comparator devices, for amplitude, frequency and phase deviations, is connected to the voltage tap 101 for the voltage of the monitored network 79. In case of amplitude deviations, a trouble signal appears at the terminal d, in case of frequency deviations, a signal at the terminal y and in case of phase jumps, a signal at the terminal s. The trouble signals are disjunctively combined in an OR gate 90, the output signal of which is coupled via a delay member 91 with drop-out delay. The output signal of the delay member 91 is fed to a command stage 92, e.g., a driver stage, which controls the line switch 78 and the inverter switch 80. The output signal of the delay member 91 is further fed to a starting unit 93 for the inverter, which prefereably starts the inverter in such a manner that its output voltage starts with the same amplitude and the same phase which the line voltage has at the instance of the disturbance. For the present considerations, it is merely important that upon the occurrence of a disturbance signal at the terminal d or y or s, the line switch 78 is opened and the inverter is started.

Switching back to the supply of the load 76 from the network 79 is accomplished with a delay through the delay member 91 and is made dependent on whether the output voltage of the inverter is in phase with the line voltage. For monitoring the phase, a first polarity detector 84 for the line voltage and a second polarity detector 85 for the output voltage of the inverter are provided. The two polarity detectors 84 and 85 change their output signal at each zero crossing of their input signals. The output signal of the polarity detector 85 is inverted by an inverter 86. The output signal of the polarity detector 84 and the inverted output signal of the polarity detector 85 are linked together in an exclusive OR gate 87. An exclusive OR gate may be, for instance, an integrated circuit gate of the types TTL-FLH or LSL FZH of Siemens AG or Type 7486 of Texas Instruments. At the output of the exclusive OR gate 87, a signal appears only if an input signal is present at only one of the two inputs. Only if the line voltage and the output voltage of the inverter are in phase, will this signal always be present. In the event of deviations of the phase or in the absence of one of the two voltages, a changing signal going between the two logic levels appears at the output of the exclusive OR gate, which is coupled via a delay member 88 and an inverter stage 89 to a further input of the OR gate 90 and has the same effect as a trouble signal from the monitoring unit 225. The delay member 88 is provided in order to suppress small deviations in the zero crossings of the respective voltages.

Figure 7C:
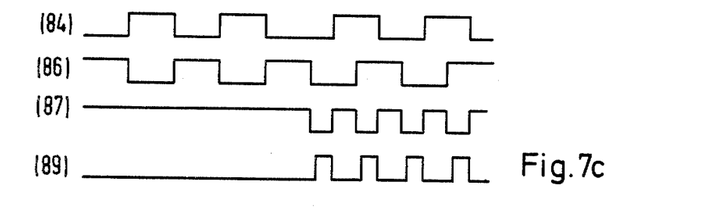
FIG. 7c is a pulse diagram for the monitoring circuit according to FIG. 7b.

FIG. 7c illustrates the exclusive OR function. Shown is the output signal of the polarity detector 84, the output signal of the polarity detector 85 inverted by the inverter 86, the output signal of the exclusive OR gate 87 and the output signal of the delay member 88 with the drop off delay inverted by the inverter 89. In the left hand portion, the line voltage and the output voltage of the inverter are in phase, while there is a phase shift in the right hand portion. Only if the output of inverter 89 remains at zero beyond the delay in delay member 91 will the switchover take place.

I claim:

1. Apparatus for monitoring an alternating (a-c) variable, comprising:
   (a) a generator circuit having as an input an actual value a-c voltage imaging the monitored a-c variable for forming a reference a-c voltage with a predetermined amplitude and frequency linked to the actual value a-c voltage in rigid phase relationship comprising:
      (i) a phase detector having said actual value a-c voltage as one input;
      (ii) a lowpass filter having its input coupled to the output of said phase detector;
      (iii) an amplifier having its input coupled to the output of said filter;
      (iv) an oscillator which is controlled by the output voltage of said amplifier, the output signal of said oscillator, which is in rigid phase relationship with the input signal of the phase detector, being fed back as a reference input to said phase detector; and
   (b) comparison means for comparing the instantaneous amplitude values of the actual value a-c voltage and reference a-c voltage to determine amplitude deviations of the monitored a-c variable, said comparison means containing a comparator circuit having as inputs the actual value a-c voltage and the output signal of said voltage controlled oscillator.

2. Apparatus according to claim 1 for use with a sinusoidal a-c variable wherein said oscillator is a voltage controlled oscillator which generates a first, square wave output signal which is in rigid phase relationship with the input signal of said phase detector, and a second, sinusoidal output signal which is shifted relative thereto by a predetermined phase angle and further including a phase shifter with a phase shift corresponding to the predetermined phase angle coupling said actual value a-c voltage to said phase discriminator, said first, square wave output signal of said voltage controlled oscillator being fed back as said reference input to said phase detector and said second, sinusoidal output signal of said voltage controlled oscillator and the actual value a-c voltage being fed to said comparator circuit.

3. Apparatus according to claim 1, wherein said comparator circuit comprises:
   (a) a first amplifier circuit having a negative bias;
   (b) a second amplifier circuit having a positive bias, both said first and second amplifiers having said reference a-c voltage as an input;
   (c) means for connecting the output voltage of said first amplifier circuit in opposition to the actual value a-c voltage to develop a first difference voltage;
   (d) a first trigger circuit having said first difference voltage as an input and adapted to change its output signal if the polarity of the difference voltage changes;
   (e) means for connecting the output voltage of said second amplifier circuit in opposition to the actual value a-c voltage to develop a second difference voltage; and
   (f) a second, similar trigger circuit having said second difference voltage as an input.

4. Apparatus for monitoring an alternating (a-c) variable, comprising:
   (a) a generator circuit having as an input an actual value a-c voltage imaging the monitored a-c variable for forming a reference a-c voltage with a predetermined amplitude and frequency linked to the actual value a-c voltage in rigid phase relationship comprising:
      (i) a phase detector having said actual value a-c voltage as one input;
      (ii) a lowpass filter having its input coupled to the output of said phase detector;
      (iii) an amplifier having its input coupled to the output of said filter;
      (iv) an oscillator which is controlled by the output voltage of said amplifier, the output signal of said oscillator, which is in rigid phase relationship with the input signal of the phase detector, being fed back as a reference input to said phase detector; and
   (b) comparison means for comparing the instantaneous frequency values of the actual value a-c voltage and reference a-c voltage to determine frequency deviations of the monitored a-c variable, said comparison means comprising at least one limit indicator with a predetermined response threshhold, having as an input, the input signal for said voltage controlled oscillator.

5. Apparatus for monitoring an alternating a-c variable, comprising:
   (a) a generator circuit having as an input an actual value a-c voltage imaging the monitored a-c variable for forming a reference a-c voltage with a predetermined amplitude and frequency linked to the actual value a-c voltage in rigid phase relationship comprising:
      (i) a phase detector having said actual value a-c voltage as one input;
      (ii) a lowpass filter having its input coupled to the output of said phase detector;
      (iii) an amplifier having its input coupled to the output of said filter;
      (iv) an oscillator which is controlled by the output voltage of said amplifier, the output signal of said oscillator, which is in rigid phase relationship with the input signal of the phase detector, being fed back as a reference input to said phase detector; and (b) comparison means for comparing the instantaneous phase values of the actual value a-c voltage and reference a-c voltage to determine phase jumps of the monitored a-c variable, said comparison means comprising a limit indicator having a predetermined response threshhold, and having as an input, the output signal of said phase detector.

6. Apparatus for controlling a device for generating alternating variables, said device having a controller receiving as an input a control difference between an actual and desired value, the output signal of said controller representing the controlled variable of the control loop of the device comprising:

(a) a generator circuit having as an input an actual value a-c voltage imaging the monitored alternating variable for forming a reference a-c voltage with predetermined amplitude and frequency linked to the actual value a-c voltage in rigid phase relationship comprising:

(i) a phase detector having said actual value a-c voltage as one input;

(ii) a lowpass filter having its input coupled to the output of said phase detector;

(iii) an amplifier having its input coupled to the output of said filter;

(iv) an oscillator which is controlled by the output voltage of said amplifier, the output signal of said oscillator, which is in rigid phase relationship with the input signal of the phase detector, being fed back as a reference input to said phase detector; and (b) comparison means for comparing the instantaneous values of the actual values and the reference a-c voltage and developing an output which is coupled as the control difference driving said controller.

7. Apparatus according to claim 6 and further including a multiplier having as one input said reference a-c voltage and as a second input a control voltage of a superposed control or regulating circuit, the output of said multiplier coupled to said comparison means.

8. Apparatus according to claim 6 for use with a control with integrating time behavior and further including a first rectifier circuit and a second rectifier circuit coupling said actual value a-c voltage and said reference a-c voltage respectively to said comparison means.

9. Apparatus according to claim 6 and further including a filter coupling said actual value a-c voltage to said comparison means.

* * * * *